United States Patent [19]
Van Damme et al.

[11] Patent Number: 5,922,507
[45] Date of Patent: Jul. 13, 1999

[54] IMAGING ELEMENT COMPRISING A TWO-PHASE LAYER HAVING A DISPERSE HYDROPHOBIC PHOTOPOLYMERISABLE PHASE

[75] Inventors: Marc Van Damme, Heverlee; Joan Vermeersch, Deinze, both of Belgium; Wolfgang Podszun; Norbert Lui, both of Köln, Germany

[73] Assignee: AGFA-Gevaert, N.V., Mortsel, Belgium

[21] Appl. No.: 08/805,940

[22] Filed: Feb. 25, 1997

[30] Foreign Application Priority Data

Feb. 26, 1996 [EP] European Pat. Off. ............. 96200482

[51] Int. Cl.⁶ .................... G03F 7/033; G03F 7/26
[52] U.S. Cl. ...................... 430/273.1; 430/288.1; 430/909; 430/949; 430/302; 430/303; 430/309; 522/121; 522/181; 522/285.1
[58] Field of Search ................ 430/285.1, 288.1, 430/273.1, 909, 949, 302, 303, 309; 522/121, 181

[56] References Cited

U.S. PATENT DOCUMENTS

| | | | |
|---|---|---|---|
| 3,910,187 | 10/1975 | Cords | 96/33 |
| 4,072,527 | 2/1978 | Fan | 96/87 R |
| 5,085,975 | 2/1992 | Mueller | 430/285.1 |

FOREIGN PATENT DOCUMENTS

| | | |
|---|---|---|
| 0 069 978 A2 | 1/1983 | European Pat. Off. . |
| 0 092 782 A2 | 11/1983 | European Pat. Off. . |
| 0 167 779 A2 | 1/1986 | European Pat. Off. . |
| 2 202 858 | 10/1988 | United Kingdom . |
| WO 92/00552 | 1/1992 | WIPO . |

*Primary Examiner*—Cynthia Hamilton
*Attorney, Agent, or Firm*—Breiner & Breiner

[57] ABSTRACT

The present invention provides a photosensitive imaging element comprising on a support a two-phase layer, said two-phase layer comprising a disperse hydrophobic photopolymerizable. phase and a hydrophilic continuous phase, characterized in that the hydrophobic photopolymerizable phase comprises a multifunctional monomer with a perfluoroalkyl or perfluoroalkenyl group.

9 Claims, No Drawings

IMAGING ELEMENT COMPRISING A TWO-PHASE LAYER HAVING A DISPERSE HYDROPHOBIC PHOTOPOLYMERISABLE PHASE

FIELD OF THE INVENTION

The present invention relates to a photosensitive imaging material comprising a two-phase layer comprising a disperse hydrophobic photopolymerisable phase and a hydrophilic continuous photopolymerizable.

BACKGROUND OF THE INVENTION

The use of photosensitive imaging elements comprising photopolymerizable compositions for the production of images by information-wise exposure thereof to actinic radiation is well known. Several methods for forming images using photopolymerizable compositions are known. All these methods are based on the principle of introducing a differentiation in properties between the exposed and non-exposed parts of the photopolymerizable composition e.g. a difference in solubility, adhesion, conductivity, refractive index, tackiness, permeability, diffusibility of penetrating substances e.g. dyes.

In general a latent image is obtained by the information-wise exposure of the imaging element which by a specific after-treatment is developed.

For example in the production of negative offset printing plates by an information-wise exposure a difference in solubility is obtained. Said difference in solubility is used in a development step for dissolving the non-exposed areas with a developing solution, yielding an image with a hydrophilic-hydrophobic contrast.

EP 502,562 discloses a method of dry development, in which the latent image is brought in contact with a receptor element at an elevated temperature. This results in the transfer of the non-exposed areas to the receptor element.

All the known development methods have in common that an extensive technical effort is needed and that furthermore liquid or solid waste is produced, which has to be safely removed which is a cumbersome operation.

SUMMARY OF THE INVENTION

It is an object of the present invention to provide an imaging element comprising a photopolymerizable composition, said imaging element being developable after exposure by heat only in an ecological way and providing a lithographic printing plate of a high quality.

It is another object of the present invention to provide a method for obtaining a lithographic printing plate of a high quality using said imaging element.

Further objects of the present invention will become clear from the description hereinafter.

According to the present invention there is provided a photosensitive imaging element comprising on a support a two-phase layer, said two-phase layer comprising a disperse hydrophobic photopolymerizable phase and a hydrophilic continuous phase, characterized in that the hydrophobic photopolymerizable phase comprises a multifunctional monomer with a perfluoroalkyl or perfluoroalkenyl group.

According to the present invention there is also provided a method for obtaining a lithographic printing plate comprising the steps of
a) information-wise exposing an imaging element according to the present invention,
b) heating the exposed imaging element.

DETAILED DESCRIPTION OF THE INVENTION

It has been found that lithographic printing plates of high quality can be obtained according to the method of the present invention using an imaging element comprising on a support a two-phase layer comprising a disperse hydrophobic photopolymerizable phase and a hydrophilic continuous phase wherein the hydrophobic photopolymerizable phase comprises a multifunctional monomer with a perfluoroalkyl or perfluoroalkenyl group.

The hydrophilic continuous phase comprises hydrophilic polymers.

Suitable polymers are e.g. polyvinylalcohol, polyvinylacetate which is saponified for at least 80% by weight, polyethers such as polyethylene oxide and polyvinyl pyrrolidone. Preferably at least 75% by weight of said polymers is polyvinylalcohol or polyvinylacetate which is saponified for at least 80% by weight. Preferably the hydrophilic polymer is hardened. Suitable hardening agents are e.g. isocyanates such as 2,4-diisocyanate toluene and preferably hydrolysed tetraalkyl orthosilicates such as hydrolysed tetramethyl orthosilicate and hydrolysed tetraethyl orthosilicate. The amount of tetraalkyl orthosilicate hardening agent is preferably at least 0.1 parts by weight, more preferably between 0.5 and 5 parts by weight per part by weight of hydrophilic polymer.

The hydrophilic layer preferably also contains finely-divided fillers. They increase the mechanical strength and the porosity of the layer. Suitable fillers are compounds on the basis of silicates, silica and alumina. The average particle size of said filllters is preferably between 0.05 and 1 μm. A particularly suitable filler is highly dispersed silica, obtained by flame hydrolysis and KIESELSOL (Trade name of Bayer AG). By incorporating these particles the surface of the layer is given a uniform rough structure of microscopic hills and valleys, which serve as storage places for water in background areas.

The disperse hydrophobic photopolymerizable phase comprises at least a multifunctional monomer with a perfluoroalkyl or perfluoroalkenyl group. Multifunctional monomers according to the present invention are monomers which contains two or more, preferably two to six, polymerizable double bonds. Preferred monomers are the esters of acrylic acid and methacrylic acid. More preferred are multifunctional methacrylates comprising perfluoroalkyl groups or perfluoroalkenyl groups with $C_4$- to $C_{12}$-perfluoroalkyl groups or $C_4$- to $C_{12}$-perfluoroalkenyl groups.

Also more preferred are (meth)acrylates comprising fluoroalkenyl groups corresponding to formula I

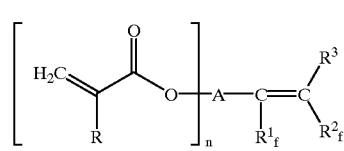

wherein
R represents hydrogen or methyl,
n represents an integer from 2 to 6,
A represents a hydrocarbon group with 3 to 30 C-atoms, linked to (n+1) groups, which may be interrupted by up to 10 oxygen atoms, $R^1_f$ and $R^2_f$ independently from each other represents a perfluoralkyl group with 1 to 20 C-atoms or $R^1_f$ and $R^2_f$ form together a $(CF_2)_x$ bridge, wherein x represents an integer from 1 to 8, $R^3$ represents hydrogen, fluorine, chlorine or a perfluoroalkyl group with 1 to 20 C-atoms.

Of course said monomers can be used in admixture.

Preferred multifunctional monomers are listed in table 1.

TABLE 1 monomer 1 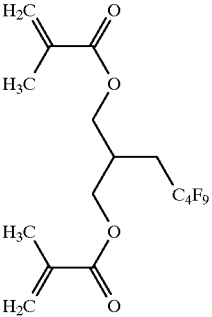

monomer 2 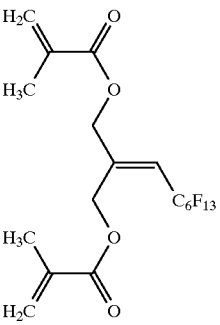

monomer 3 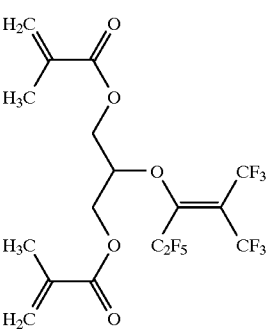

monomer 4 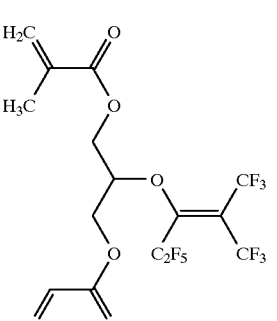

TABLE 1-continued monomer 5 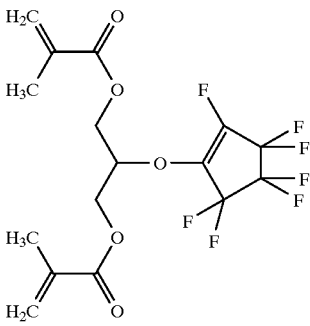

monomer 6 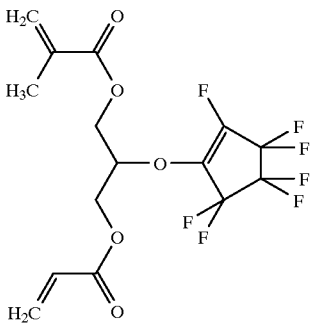

The disperse hydrophobic photopolymerizable phase comprises at least one photoinitiator, which can be a single compound or a composition. Preferably used photoinitiators are polymerization initiators activatable by actinic light and inactive at and below 185° C. Examples of such initiators are substituted and unsubstituted polycyclic quinones, i.e. compounds with two carbonyl groups, connected to ring carbon atoms in a six-membered conjugated carbocyclic nucleus, wherein at least one aromatic, carbocyclic ring is condensated to the ring containing the carbonyl groups. Such initiators comprise 9,10-anthraquinone, 1-chloranthraquinone, 2-chloranthraquinone, 2-methylanthraquinone, 2-t.butylanthraquinone, octamethylanthraquinone, 1,4-naphthoquinone, 9,10-phenanthrenequinone, 1,2-benzanthraquinone, 2,3-dichlomaphthoquinone, the sodium salt of anthraquinone-α-sulphonic acid, 3-chlor-2-methyl-anthraquinone and 1,2,3,4-tetrahydrobenzo[a]-antracene-7,12-dione. Further suitable photoinitiators are described in U.S. Pat. No. 2,760,863, which therefor is incorporated herein by reference and include vicinal ketaldonyl compounds such as diacetyl, benzyl, α-ketaldonylalcohols such as benzoin, pivalone, acyloinether f.i. benzoinmethyl- and ethylether, α-hydrocarbon substituted aromatic acyloines including methylbenzoine, α-allylbenzoin and α-phenylbenzoin. Further suitable photoinitiators are described in "Photoreactive Polymers" of Arnost Reiser, "Organic photochemical imaging systems" of G. A. Delzenne, in "UV-Curing Chemistry: Past, Present and Future" of Christian Decker, published in Journal of Coatings Technology, Vol. 59, Nr. 751 (August 1987), pages 97–106 and in EP-A 362,827 and U.S. Pat. No. 3,558,309.

According to the present invention thermal polymerization inhibitors may also be added to the photopolymerizable phase. In this way the storage stability of the imaging material is clearly improved. Suitable inhibitors are for example p-methoxy-phenol, hydroquinone, alkyl- and acyl-substituted hydroquinones and quinones, tert.- butylpyrocatechol, pyrogallol, copper derivatives, naphthylamine, β-naphthol, copper(II)chloride, 2,6-bis-tert-butyl-p-cresol, photothiazine, pyridine, nitrobenzene, dinitrobenzene, p-toluenequinone and chloranil.

In many cases it is advantageous to add one or more thermoplastic polymers to the photopolymerizable phase. The thermoplastic polymers have preferably a softening point in the range from 40° C. to 250° C.

Suitable thermoplastic polymers for use in accordance with the present invention include (A) Polyvinylchloride and its copolymers, f.i. polyvinylchloride/polyvinylacetate (B) Vinylidenechloride-copolymers, f.i. vinylidenechloride/acrylonitrile-, vinylidenechloride/methacrylate- and vinylidenechloride/vinylacetate-copolymers (C) Polyvinylesters, f.i. polyvinylacetate, polyvinylacetate/polyvinylacrylate, polyvinylacetate/polyvinylmethacrylate (D) Polyacrylates and polymethacrylates, f.i. polymethylmethacrylate (E) Polystyrene and copolymers, f.i. polystyrene/polyacrylonitrile, polystyrene/polyacrylate, polystyrene/polyacrylonitrile/polybutadiene (F) Ethylene/vinylacetate copolymers (G) Polyvinylacetals, f.i. polyvinylbutyral, polyvinylformal.

The two-phase layer comprises in general surfactants for a better stability and an easier preparation. Suitable surfactants are anionic surfactants such as alkylsulphonates, cationic surfactants such as tetraalkylammonium chloride and non-ionic surfactants such as ethoxylated nonylphenol. Also suitable surfactants are fluor- and silicon-containing surfactants.

The imaging element according to the present invention can contain other layers f.i. a layer for improving the adhesion of the two-phase layer to the support. For the improvement of said adhesion on a support of polyethyleneterephthalate, a subbing layer comprising hardened gelatin or comprising a copolymer of vinylidenechloride and vinylacetate is suited.

The average particle size of the disperse hydrophobic phase is in general comprised between 0.1–10 μm, preferably between 0.2–2 μm. The ratio by weight of the disperse phase to the continuous phase lies between 20/80 and 70/30, preferably between 30/70 and 60/40. The thickness of the two-phase layer is in general comprised between 1 and 40 μm, preferably between 2 and 20 μm.

In a preferred embodiment of the present invention the imaging element comprises a hardened hydrophilic covering layer on top of the two-phase layer. The hydrophilic covering layer can consist of the same polymers, which were disclosed for the hydrophilic phase of the two-phase layer. Preferred also in this case is that at least 75% by weight of said polymers is polyvinylalcohol or polyvinylacetate which is saponified for at least 80% by weight, which is hardened with tetraalkyl orthosilicates. Also preferred is the use of the above disclosed fillers. The thickness of the hydrophilic covering layer amounts to 0.5–10 μm, preferably to 1–5 μm.

Suitable supports in accordance with the present invention are flexible supports. Said supports may be opaque or transparent, e.g. a paper support or resin support. Metal foils can also be used as support. Preferably the support is a resin support. Examples of resin supports are cellulose esters, polycarbonate, polyamides, polyesters. Particularly preferred is polyethyleneterephthalate. The thickness of the support is not critical for the present invention. Typical supports with a thickness between 50 μm and 500 μm are used.

The preparation of the photosensitive imaging element can be executed in an effective way by coating techniques. The coating solution is an aqueous emulsion. The coating emulsion comprises the polymers of the hydrophilic phase as solutes, including the hardeners and optionally the surfactants and the fillers. In case tetraalkyl orthosilicate is used as hardener, it is preferred to activate the hardener immediately before its use by addition of water and acids. During this activation the less active alkylorthosilicates are transferred in the more active silanol groups. The coating solution furthermore comprises the compounds of the hydrophobic photopolymerizable phase in the form of dispersed droplets. In the case that the mixture of the components is not sufficiently liquid an organic, water immiscible solvent can be added as a thinner. Suitable solvents for this case are e.g. toluene, chloroform and ethylacetate. The average size of the droplets is effectively adjusted with the aid of an effective mixer and is controlled with e.g. a measuring microscope. Suitable mixers are e.g. Rotor-Stator mixers, high shear mixers, pearl mills, ball mills etc. In the case that no thinner is used, the average size of the droplets in the coating solutions is practically the same as the average size of the particles of the disperse hydrophobic photopolymerizable phase in the imaging element. In the case that a thinner is used, the size of the dispersed particles diminish naturally when drying corresponding to the relative amount of the thinner.

The imaging element according to the invention is exposed with actinic irradiation in order to harden totally or partially the photopolymerizable phase image-wise according to the distribution of the actinic irradiation. Said exposure can be a contact exposure with the aid of UV or visible irradiation, an exposure with the aid of a camera, a scanning exposure or an exposure with a laser. As source of light can be used daylight, incandescent lamps, mercury gas lamps, halogen lamps, xenon lamps, fluorescent lamps, light emitting diodes or lasers. Of course the emission spectrum of the light source should overlap with the absorption spectrum of the photoinitiator. The energetic sensitivity of the imaging element according to the invention is high, in general it accounts from $5 * 10^3$ to $10^5$ mJ/m$^{2.}$ The latent image obtained by the exposure of the imaging element is developed by heat. The temperature should be between 80° C. and 150° C. preferably between 90° C. and 130° C. The heating can be executed in an oven and takes then a few minutes e.g. 2–10 minutes. By using an heating apparatus with a more efficient heat transfer such as heating rollers or heating metal plates, the necessary development time takes only a few seconds. Also the use of infrared irradiation or microwave sources can accelerate the development. By the development an image is obtained with a clearly visual contrast. The surface has a high information-wise hydrophilic-hydrophobic contrast.

Preferably, the imaging element according to the invention is used for the preparation of lithographic printing plates.

The imaging element according to the invention is easy to handle and particularly ecological. The prints obtained with lithographic printing plates in accordance with the invention are free of fog and exhibit a high image quality, in particular a high resolution and good edge sharpness.

The invention will now be illustrated by the following examples without however the intention to limit the invention thereto. All parts are by weight unless otherwise specified.

EXAMPLE 1

(synthesis of monomer 3 of table 1)

To 150 g of glycerinedimethacrylate and 200 g of perfluor-(2-methyl-pentene-2) in 500 ml of acetonitrile were room temperature 100 g of triethylamine. After 10 hours of stirring at room temperature were added 500 ml of water and the organic phase is separated. The aqueous phase is twice extracted with 200 ml of methylene chloride. The organic phases were put together and after each other extracted with 100 ml of water, 100 ml of 1N aqueous hydrochloric acid and 100 ml of water. Next, the organic phase is dried on sodium sulphate. After evaporation of the solvent under vacuum there is obtained 270 g of 2-methyl-acrylic acid-[3-(2-methyl-acryloxyloxy)-2-(3,3,3-trifluormethyl)-1-(1,1,2,2,2-pentafluorethyl-2-trifluormethyl-propenyloxy)]-propylester. Yield: 82%.

$^{19}$F-NMR-date: $\delta(CDCl_3)$ - 56,2 - 59,6 - 80,6 - 113,4 ppm
$^1$H-NMR-data : $\delta(CDCl_3)$ - 1,95 (s, 6H) - 4,4 (m, 4H) - 5,0 (m, 1H) - 5,65 (m, 2H) - 6,15 (m, 2H) ppm.

EXAMPLE 2

(synthesis of monomer 5 from table 1)

To 11,4 g of glycerinedimethacrylate and 10,6 g of perfluorcyclopentene in 30 ml acetonitrile were slowly added at room temperature 10 g of triethylamine. After stirring for 10 hours at room temperature, 100 ml of water are added and the organic phase separated. The aqueous phase is twice extracted with 50 ml of methylene chloride. The united organic phases were after each other extracted with 50 ml of water, 50 ml of 1N hydrochloric acid and 50 ml of water. The united organic phases were dried in the presence of sodium sulphate. After the evaporation of the solvent under vacuum, 19 g of 2-methyl-acrylic acid-[3-(2-methylacryloyloxy-2-(2,3,3,4,4,5,5-heptafluorocyclopentenyloxy)]-propylester is obtained.

Yield: 90%. $^{19}$F-NMR-data: $\delta(CDCl_3)$-115,6 - 116,5 -130,1 -159 ppm $^1$H-NMR-data: $\delta(CDCl_3)$-1,95 (s, 6H) -4,4(m, 4H)-5,05 (m, 1H)-5,65 (m, 2H)-6,15 (m, 2H) ppm.

EXAMPLE 3

2,12 g of polyvinylalcohol Moviol 66-100 (Moviol is a registered trade name of Hoechst AG) and 400 mg of perfluoroctanic acid diethylene glycol ester (surfactant) were dissolved in 97 g of water. In this solution 1 g of siliciumdioxide Aerosil 380 (Aerosil is a registered trade name of Degussa A.G.) is dispersed with the aid of an Ultraturax. Next, a solution of 6 g of monomer 3 of table 1, 300 mg of benzyldimethylketal as photoinitiator and 3 mg of Vulkanox KB (Vulkanox KB is a registered trade name of Bayer A.G.) as stabilizer was added and emulsified with the aid of an Ultraturax, whereby a size diameter of the droplets of about 1 μm was obtained (measured with a measuring microscope). The emulsion was diluted with a mixture of 1.7 g of tetramethyl orthosilicate, 1 g of water, 2 g of ethanol and 2 g of concentrated hydrochloric acid and yielded thereby a ready to use coating solution, which can be used for about 6 hours. The coating solution was coated in a thickness of 100 μm with a doctor blade on a polyethylene terephthalate foil of 100 μm thick as support. After drying for 2 hours at 50° C. the thickness of the layer was about 10 μm.

The imaging element was brought in contact with a transparent testfoil with 60 lines pre cm and irradiated with UV-light through the test foil (exposure apparatus DL 2000, 250 units).

The exposed imaging element is heated for 6 minutes at 130° C. in a drying oven. Hereby an image is obtained with a high resolution, faithful dot copy and good edge sharpness.

EXAMPLE 4 a) Coating solution for the two-phase layer.

2.6 g of polyvinylalcohol Moviol 66-100 (Moviol is a registered trade name of Hoechst and 400 mg of perfluoroctanic acid diethylene glycol ester as surfactant were dissolved in 97 g of water and diluted with 4 g of Kieselsol with a content of siliciumdioxide of 30% by weight (Kieselsol is a registered trade name of Bayer A.G.). Next a solution of 12 g of chloroform, 6 g of monomer 5 of table 1, 300 mg of benzyldimethylketal as photoinitiator and 3 mg of Vulkanox KB (Vulkanox KB is a registered trade name of Bayer A.G.) as stabilizer was added and emulsified with the aid of an Ultraturax, whereby droplets with an average size of about 1.5 μm were obtained (measured with a measuring microscope). The emulsion was diluted with a mixture of 1.7 g of tetramethyl orthosilicate, 1 g of water, 2 g of ethanol and 2 g of concentrated hydrochloric acid and yielded in this way the coating solution for the two-phase layer, which can be used for about six hours.

b) Coating solution for the hydrophilic covering layer.

2,5 g of polyvinylalcohol Moviol 66-100 (Moviol is a registered trade name of Hoechst) and 500 mg of perfluoroctanic acid diethylenglycol ester as surfactant are dissolved in 84.10 g of water. In this emulsion 6,2 g of siliciumdioxide Aerosil 380 (Aerosil is a registered trade name of Degussa A.G.) is dispersed with the aid of an Ultraturax. Next, a mixture of 1,7 g tetramethyl orthosilicate, 1 g of water, 2 g of ethanol and 2 g of concentrated hydrochloric acid were added to this dispersion. The obtained coating solution can be used for about 6 hours.

c) Preparation and testing of the offset printing plate.

The coating solution a) was coated in a thickness of 100 μm with a doctor blade on a subbed polyethyleneterephthalate foil with a thickness of 175 μm as support. After drying for 2 hours at 50° C. the coating solution b) was coated in a thickness of 50 μm with a doctor blade and once more dried for 2 hours at 90° C.

The imaging material was brought in contact with a transparent test foil with 60 lines per cm and irradiated with UV-light through the test foil (exposure apparatus DL 2000, 250 units).

The exposed imaging element was heated for 6 minutes at 130° C. in a drying oven, whereby a printing plate suited for offset printing was obtained. With these printing plate it was possible to print in a conventional printing apparatus with conventional inks. Prints with good printing properties (high resolution, faithful dot copy and good edge sharpness) were obtained.

We claim:

1. A photosensitive imaging element comprising on a support a two-phase layer, said two-phase layer comprising a hydrophilic continuous phase containing a hardened hydrophilic polymer and a dispersed hydrophobic photopolymerizable phase that comprises a photoinitiator and a multifunctionally polymerizable monomer with a perfluoroalkyl or perfluoroalkenyl group.

2. A photosensitive imaging element according to claim 1, wherein the hydrophobic photopolymerizable phase comprises a multifunctionally-polymerizable monomer with a $C_4$- to $C_{12}$-perfluoroalkyl group or with a $C_4$- to $C_{12}$-perfluoroalkenyl group.

3. A photosensitive imaging element according to claim 1, wherein the hydrophobic photopolymer-izable phase comprises a multifunctionally polymerizable monomer with perfluro-alkenyl groups according to formula I.

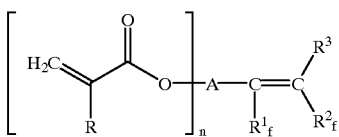

wherein:

R represents hydrogen or methyl, n represents an integer from 2 to 6,

A represents a hydrocarbon group with 3 to 30 C-atoms, linked to (n+1) groups, optionally interrupted by up to 10 oxygen atoms, $R^1_f$ and $R^2_f$ independently from each other represents a perfluoroalkyl group with 1 to 20 C-atoms or $R^1_f$ and $R^2_f$ form together a $-(CF_2)_x$-bridge wherein x represents an integer from 1 to 8, $R_3$ represents hydrogen, fluorine, chlorine or a perfluoroalkyl group with 1 to 20 C-atoms.

4. A photosensitive imaging element according to claim 1 wherein the hydrophobic photopolymerizable phase is formed of particles having an average particle size comprised between 0.1 and 10 μm.

5. A photosensitive imaging element according to claim 1 wherein the thickness of the two-phase layer is comprised between 1 and 40 μm.

6. A photosensitive imaging element according to claim 1 wherein the hydrophilic continuous phase comprises one or more hydrophilic polymers, at least 75% by weight of said polymers is polyvinylalcohol or polyvinylacetate which is saponified for at least 80% by weight.

7. A photosensitive imaging element according to claim 1 wherein said photosensitive imaging element comprises a hardened hydrophilic covering layer on top of the two-phase layer.

8. A photosensitive imaging element according to claim 7, wherein said hardened hydrophilic covering layer comprises one or more hydrophilic polymers, at least 75% by weight of said polymers is polyvinylalcohol or polyvinylacetate which is saponified for at least 80% by weight.

9. A method for obtaining a lithographic printing plate comprising the steps of a) information-wise exposing to actimic radiation an imaging element according to claim 1, b) heating the exposed imaging element.

* * * * *

UNITED STATES PATENT AND TRADEMARK OFFICE
CERTIFICATE OF CORRECTION

PATENT NO. : 5,922,507

DATED : July 13, 1999

INVENTOR(S) : Marc Van Damme et al

It is certified that error appears in the above-indentified patent and that said Letters Patent is hereby corrected as shown below:

Column 1, line 9, "photopolymerisable" should read
-- photopolymerizable --.

Column 1, line 10, delete "photopolymerizable" and insert
-- phase --

Column 1, line 58, "layer,said" should read
-- layer, said --.

Column 2, line 24, each occurrence of "hydrolysed" should
read -- hydrolyzed --.

Column 2, line 25, "hydrolysed" should read
-- hydrolyzed --.

Column 2, line 34, "fillters" should read -- fillers --.

Column 2, line 47, "More" starts a new paragraph.

Column 3, line 2, "perfluoralkyl" should read
-- perfluoroalkyl --.

Column 3, line 3, "$(CF_2)_x$" should read -- $(CF_2)_x$ --.

Column 4, line 45, "dichlomaphthoquinone" should read
-- dichlornaphthoquinone --.

Column 7, line 4, after "were", insert
-- slowly added at --.

UNITED STATES PATENT AND TRADEMARK OFFICE
CERTIFICATE OF CORRECTION

PATENT NO. : 5,922,507
DATED : July 13, 1999
INVENTOR(S) : Marc Van Damme et al

It is certified that error appears in the above-indentified patent and that said Letters Patent is hereby corrected as shown below:

Column 7, line 62, delete "pre" and insert -- per --.

Column 8, Claim 3, line 65, "photopolymer-izable" should read -- photopolymerizable --.

Column 8, Claim 3, line 67 "perfluro-alkenyl" should read -- perfluoroalkenyl --.

Column 10, Claim 9, line 22, "actimic" should read -- actinic --.

Signed and Sealed this

Eighteenth Day of April, 2000

Attest:

Q. TODD DICKINSON

Attesting Officer

Director of Patents and Trademarks